(12) United States Patent
Hoeland et al.

(10) Patent No.: US 8,269,117 B2
(45) Date of Patent: Sep. 18, 2012

(54) HOUSING FOR AN ELECTRIC OR ELECTRONIC DEVICE

(75) Inventors: Karsten Hoeland, Bochum (DE); Achim Matt, Duisburg (DE); Sebastian Schulze, Quedlinburg (DE)

(73) Assignee: KROHNE Messtechnik GmbH, Duisburg (DE)

( * ) Notice: Subject to any disclaimer, the term of this patent is extended or adjusted under 35 U.S.C. 154(b) by 367 days.

(21) Appl. No.: 12/576,396

(22) Filed: Oct. 9, 2009

(65) Prior Publication Data

US 2010/0089635 A1  Apr. 15, 2010

(30) Foreign Application Priority Data

Oct. 10, 2008  (DE) .......................... 10 2008 050 914
Nov. 11, 2008  (DE) .......................... 10 2008 056 817

(51) Int. Cl.
*H01R 13/502* (2006.01)
(52) U.S. Cl. ........................................ 174/561; 361/667
(58) Field of Classification Search .................. 174/659, 174/665, 561; 361/667
See application file for complete search history.

(56) References Cited

U.S. PATENT DOCUMENTS

| 6,921,275 | B2 | 7/2005 | Rehmann et al. | |
|---|---|---|---|---|
| 2003/0037951 | A1* | 2/2003 | Hulsmann et al. | 174/65 R |
| 2008/0017399 | A1* | 1/2008 | Ashibe et al. | 174/77 R |

FOREIGN PATENT DOCUMENTS

| DE | 101 26 654 A1 | 12/2002 |
|---|---|---|
| DE | 103 19 187 A1 | 11/2004 |
| DE | 20 2006 003 433 U1 | 8/2007 |
| EP | 1 752 944 A2 | 2/2007 |
| WO | 2004/017025 A1 | 2/2004 |
| WO | 2004/017026 A1 | 2/2004 |
| WO | 2006/030004 A1 | 3/2006 |
| WO | 2007/090421 A1 | 8/2007 |

* cited by examiner

*Primary Examiner* — Hung Ngo
(74) *Attorney, Agent, or Firm* — Roberts Mlotkowski Safran & Cole, P.C.; David S. Safran

(57) ABSTRACT

A housing for an electric or electronic device has at least one receiving part for accommodating electric and/or electronic components, parts, component groups and parts groups in an interior thereof has at least one locking part for closing the receiving part, and having a bayonet connector for connecting the at least one locking part with the at least one receiving part. The bayonet connector has a first connector part on the locking part and a second connector part on the receiving part which engage each other in a connected position. One of the first and second connector parts has a base and head in respective planes running perpendicular to a direction of insertion of the connector parts and a diagonal surface running diagonally from the base toward a head, the base, diagonal surface and head being distributed alternately around the entirety periphery of the first connector part.

9 Claims, 5 Drawing Sheets

HOUSING FOR AN ELECTRIC OR ELECTRONIC DEVICE

BACKGROUND OF THE INVENTION

1. Field of Invention

The invention relates to a housing for an electric or electronic device having at least one electric or electronic component, part, component group and/or parts group accommodated in the interior of its receiving part and having at least one locking piece closing the receiving part.

2. Description of Related Art

In the scope of the invention, "electronic or electric device" should be understood generally. Whether an electric device or an electronic device is present, can often not be distinguished. If such a device has only—generally conventional—electric components, parts, component groups and/or parts groups, then we are generally dealing with an electric device. On the other hand, we would be dealing with an electronic device, when it has—only, almost only or mostly—electronic components, parts, component groups and/or parts groups. A functional distinction is often made between an electric device and an electronic device. Electric devices are often those, which are functionally more likely to have a conservative construction. On the other hand, it is often the case of an electronic device when there is functionally more modern construction, in particular, when it includes conductor technology in the widest sense.

In the scope of the invention, an electric or electronic device should be understood that has a multiple-unit functionality, in which two or more devices are present as it were, which complement each other functionally, the desired functional efficiency is thus only desired and achieved in cooperation of the individual devices.

The housing that is dealt with in the invention can be such that its interior accommodates all of the electric or electronic components, parts, component groups and/or parts groups required for the functional efficiency of the corresponding electric or electronic devices, that a functionally efficient electric or electronic device is constructed with the electric and/or electronic components, parts, component groups and/or parts groups provided in its interior. However, the housing that is dealt with in the invention can also be such that, in the sense of the afore-mentioned multiple-unit construction of an electric or electronic device, that the interior only receives a portion of the electric and/or electronic components, parts, component groups and/or parts groups required for the functional efficiency—so that further electric and/or electronic components, parts, component groups and/or parts groups required for function are placed elsewhere, possibly again in a corresponding housing, but possibly also at a completely different location, spatially more or less strongly separated.

It is mentioned above that the invention deals with a housing for an electric or electronic device having at least one receiving part and at least one locking part. The wording "having" is intended to make it clear that, opposed to the wording "is composed of," a comprehensive list is not intended. The housing, which is dealt with in the invention, can thus, on the one hand, have multiple receiving parts, and on the other hand, multiple locking parts,—however, it is also possible that, in addition to one receiving part or multiple receiving parts, and in addition to one locking part or multiple locking parts, other functional parts are also included.

If the housing being discussed here has multiple receiving parts, the receiving parts can have either multiple interiors or just one interior—formed of two or more receiving parts. The realization of multiple interiors, which are then separated from one another in different manners or, respectively, can or even must be separated from one another, often depends on the application of the corresponding electric or electronic device, often also on which electric and/or electronic components, parts, component groups and/or parts groups are to be received, which voltages and which currents exist, whether electric energy is transformed substantially into heat inside of the housing and/or whether explosion protection needs to be realized in the corresponding electric or electronic device.

A housing for an electric or electronic device naturally has to be designed so that electric cables and/or wires can be lead into the housing and/or can be lead out of the housing. This possibility can be realized on the receiving part, but this can, however—and is often the case—be realized on the locking part.

If the housing being discussed here has two or more locking parts, these locking parts can be designed with functional differences. If two locking parts are provided, both locking parts can have solely the function of locking the interior of the receiving part; in this embodiment, the leading in and out of electric cables and/or wires has to be realized in the area of the receiving part. If two locking parts are realized, one locking part can have the sole function of locking the interior of the receiving part, while the second locking part can have a dual function, on the one hand, of locking the interior of the receiving part, and on the other hand, of leading in and leading out electric cables and/or wires. In the embodiment having two locking parts, both locking parts can also have the above-mentioned dual function. What is described above relating to two locking parts also applies correspondingly when more than two locking parts are realized.

In the following, the term locking part is always used when at least also the interior of the receiving part, the interior of two receiving parts or the interior of at least one receiving part—completely or partially—is locked or, respectively, closed therewith.

The spatial geometry in the housing, which is being dealt with in the invention, can be of a completely different design for the receiving part and the locking part, wherein the spatial geometry of the locking part or, respectively, locking parts naturally has to occur taking into consideration the spatial geometry of the receiving part.

Preferably, the receiving part or, respectively, the receiving parts are designed cylindrically, especially circular cylindrically. This does not rule out that the receiving part can taper on one or both sides or that the receiving part tapers on at least one side.

In a preferred embodiment of the housing, which is being dealt with in the invention, two receiving parts are realized, wherein the second receiving part is arranged like a dome on the first receiving part.

Housings for electric or electronic devices of the type being discussed here are known with different designs, in particular, from German patent application publication 101 26 654 and PCT patent application publication WO 2004/017025.

In housings of the type being discussed here, the mechanical connection of the locking part or, respectively, locking parts with the receiving part or, respectively, when multiple receiving parts are realized, the mechanical connection of the receiving parts among themselves and the connection of the locking part with a receiving part or the connection of a locking part with the receiving part occur by means of a screw connection. This is not free of disadvantages since, on the one hand, a screw connection is relatively time-consuming, and on the other hand, if screwdrivers having a defined torque are not used, the efficiency of the mechanical connection is dependent on the accurateness of whoever produced the manual connection.

SUMMARY OF THE INVENTION

A primary object of the invention is, thus, to provide a housing for an electric or electronic device in which the above-mentioned mechanical connection of the locking part, or respectively, locking parts with the receiving part or, respectively, receiving parts can be particularly easily and reproducibly carried out.

The housing according to the invention in which the above derived and shown object is met, is first and essentially characterized in that, between the locking part and the receiving part or, respectively, the locking parts and the receiving part or, respectively, the locking parts and the receiving parts, at least one bayonet connector. (Regarding what can be understood by a bayonet connector, different references can be referred to, in particular, "Wikipedia, The Free Encyclopedia".)

In a normal bayonet connector, one part is pushed over the other. The part that is pushed over the other part has a longitudinal slot, which has a short transverse slot at its end. In contrast, the other part has a stud that is inserted into the transverse slot and then ensures a secure connection. The connection thus occurs by means of an insertion and rotational motion. Both of the parts to be connected are placed one in the other; longitudinal ridges are mounted at the connection joint on both parts approximately normal to the direction of insertion. However, the ridges do not run all the way around, being interrupted (otherwise, the pushing together of the parts would not be possible). Since the ridges are slightly diagonal to the direction of insertion, both parts are pressed together in a rotary motion. The bayonet connector thus acts as a threading.

What was described above in relation to a normal bayonet connector has one disadvantage in respect to the housing according to the invention, namely, that between both parts, presently a gap, which is not the same over the entirety, remains between the locking part and the receiving part or, respectively, between the locking parts and the receiving parts.

In a preferred embodiment of the housing according to the invention, a "special" bayonet connector is realized for that reason, namely one, in which a uniform gap is realized in the connected position, preferably always a gap having a gap width of zero. This can preferably be realized in detail in that the bayonet connector, which consists of a first bayonet part and a second bayonet part, has alternately distributed over the entirety on the first bayonet part a base perpendicular in the plane, running perpendicular to the direction of insertion, a diagonal surface connecting to the base and a head running perpendicular to the direction of insertion connecting to the upper end of the diagonal surface. The head, running perpendicular to the direction of insertion on the first bayonet part is then assigned an opposing surface also running perpendicular to the direction of insertion on the second bayonet part. In the connected position, the opposing surface of the second bayonet part lies on the head of the first bayonet part. Thus, two surfaces running perpendicular to the direction of insertion correspond, namely, the opposing surface on the second bayonet part and the head on the first bayonet part. As a result—seen over the entirety—there is always a uniform gap, preferably a gap having a gap width of zero.

Further, above, it is described that, in a normal bayonet connector, the ridges are slightly diagonal in the plane perpendicular to the direction of insertion, so that both parts are pressed against one another by a rotary motion, thus, the bayonet connector acts as a threading. Based on this view, it applies for the housing according to the invention that the bayonet connector realized there first acts as a threading, then, before reaching the connected position, at the latest, however, upon reaching the connected position, a thread-like function is no longer present, since namely the head realized on the first bayonet part as well as the opposing surface realized on the second bayonet part run perpendicular to the direction of insertion, i.e., not diagonal to the direction of insertion.

It was described above that, in the scope of the invention, an electric or electronic housing can also be understood as one that has a multiple-unit functionality in which two or more devices are present, as it were, that complement each other functionally, i.e., the desired functional efficiency is only desired and achieved with a cooperation of the individual devices, that the housing according to the invention has multiple receiving parts, on the one hand, and multiple locking parts on the other hand, and that, then, when the housing being discussed here has multiple receiving parts, the receiving parts can realize multiple interiors, or however, also just one interior—formed of two or more receiving parts, wherein multiple interiors can or must be separated or, respectively, detached from one in another in different ways.

An object of the invention is also, independent of that which was described above in relation to the bayonet connector realized according to the invention, that an electric or electronic device having a housing having at least two receiving parts—accommodating electric and/or electronic components, parts, component groups and/or parts groups in its interior—and having at least one locking part closing the receiving part that is characterized by a modular construction, in which, namely, a functional unit having its own functional efficiency is provided in each receiving part. For example, a functional unit could be a power supply unit, another functional unit could be a measuring unit, and in turn, another functional unit could be an evaluation unit.

In detail, there are multiple possibilities to design and further develop the housing according to the invention. In this case, reference is made to the following detail description in connection with the accompanying drawings.

DETAILED DESCRIPTION OF THE INVENTION

Figure 1:
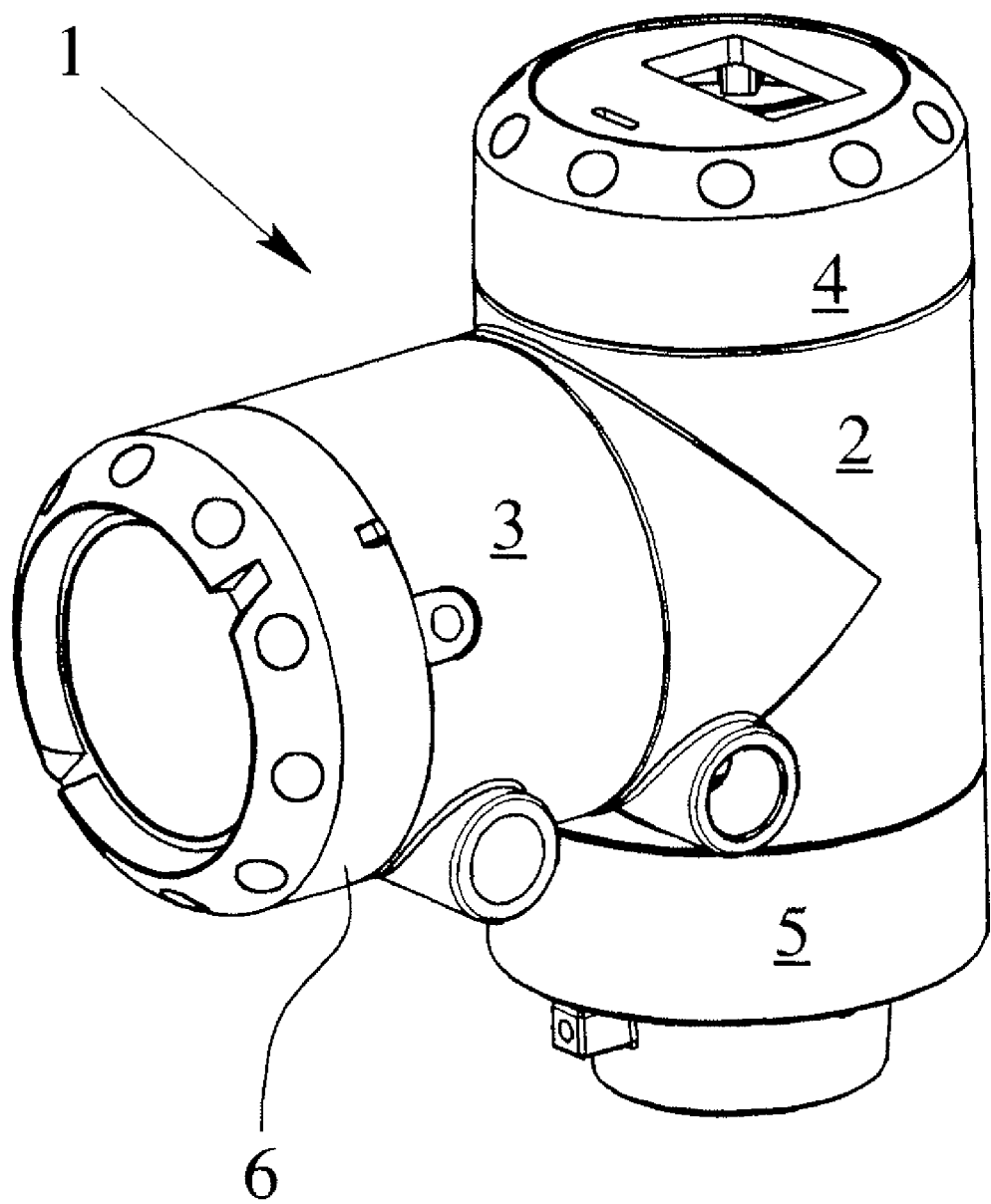
FIG. 1 shows a preferred embodiment of the housing according to the invention for an electric or electronic device.
Figure 2:
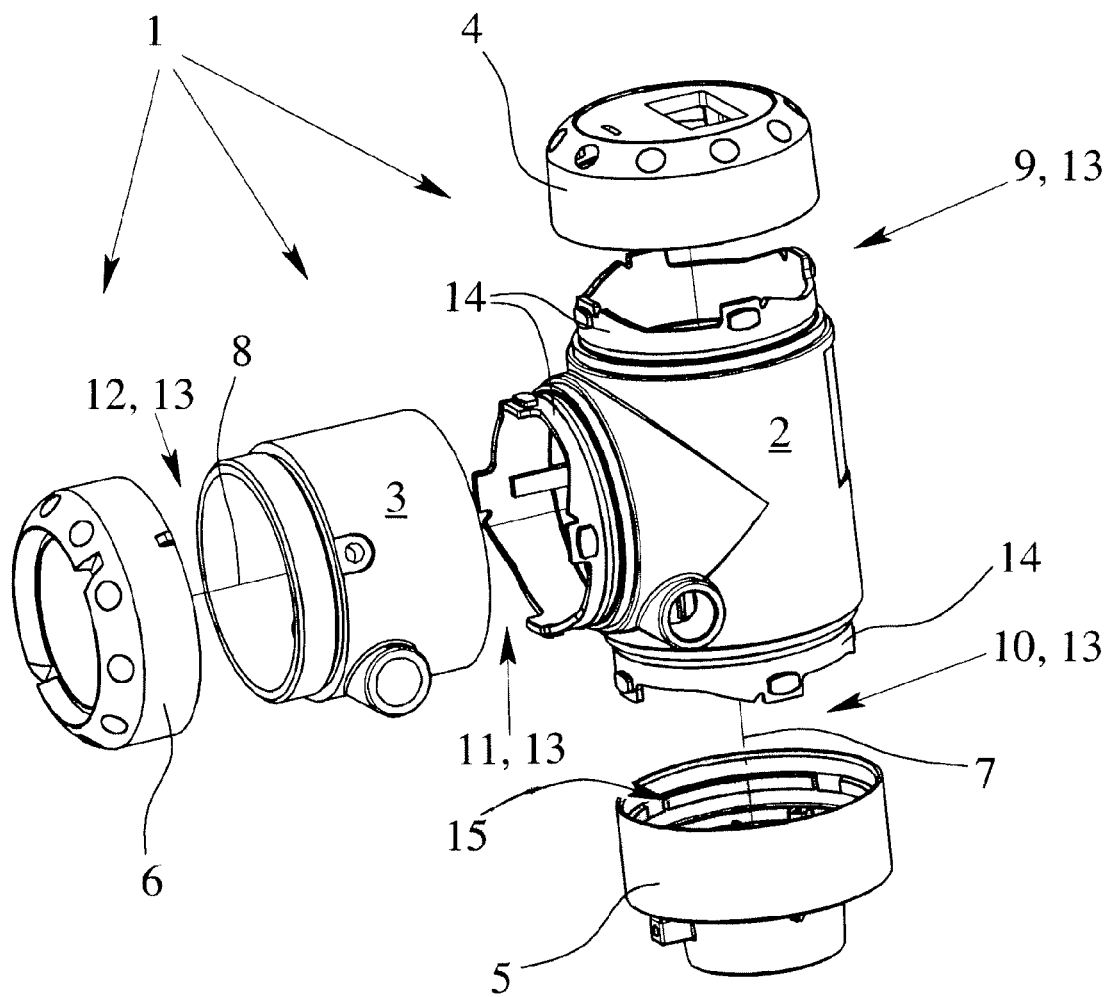
FIG. 2 is an exploded view of the housing according to FIG. 1.

The housing 1 shown in FIGS. 1 & 2 is intended for an electric or electronic device—or part of an electric or electronic device. Two electric and/or electronic components, parts, component groups and/or parts groups incorporating receiving parts 2, 3 in their interior and locking parts 4, 5 and 6 closing the receiving parts 2, 3 in the embodiment belong to the shown housing 1.

The receiving parts 2, 3 are cylindrically designed in the embodiment of a housing 1 according to the invention shown in FIGS. 1 & 2, having principal axes 7, 8. The second receiving part 3 is arranged with its principal axis 8 perpendicular to the principal axis 7 of the first receiving part 2; it is, so to speak, provided in a dome-like manner on the first receiving part.

In the embodiment of a housing 1 according to the invention shown in FIGS. 1 & 2, which is particularly clearly demonstrated in FIG. 2, there are four connection joints 9, 10, 11, 12 between the receiving parts 2, 3 and the locking parts 4, 5, 6, namely, the connection joint 9 between the receiving part 2 and the locking part 4, the connection joint 10 between the receiving part 2 and the locking part 5, the connection joint 11 between the receiving parts 2, 3 and the connection joint 12 between the receiving part 3 and the locking part 6.

According to the invention, a bayonet connector 13 is realized between each locking part 4, 5, 6 and each receiving part 2, 3 as well as between the receiving parts 2, 3, wherein each bayonet connector 13 has a first bayonet part 14 and a second bayonet part 15. For an explanation of how a bayonet connector looks and is realized, please refer to the corresponding description above.

In the preferred embodiment of a housing 1 according to the invention, as is shown in FIGS. 1 & 2, a "special" bayonet connector 13 is realized, namely one that always realizes a uniform gap in the connected position, preferably always a gap with a gap width of zero, i.e., flush contact is obtained.

Figure 3:
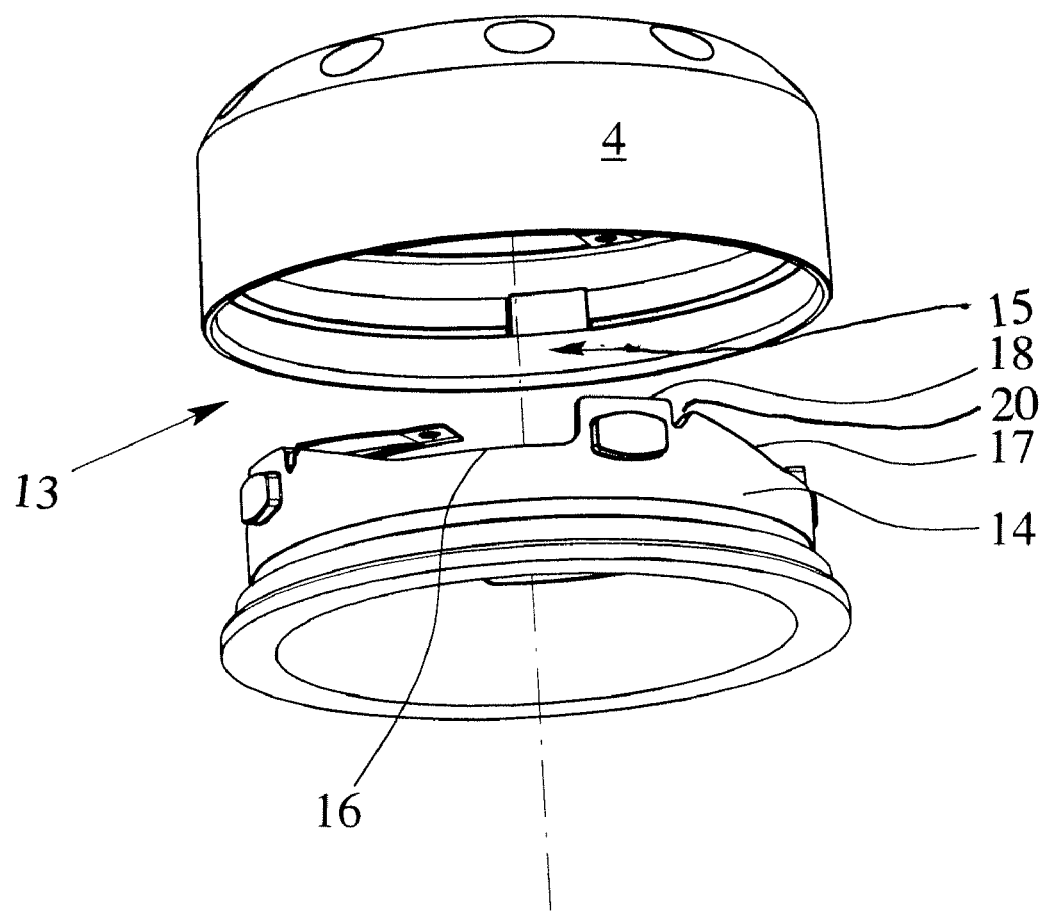
FIG. 3 shows the upper section of the housing shown in FIG. 2, enlarged relative to the showing thereof in FIG. 2.
Figure 4:
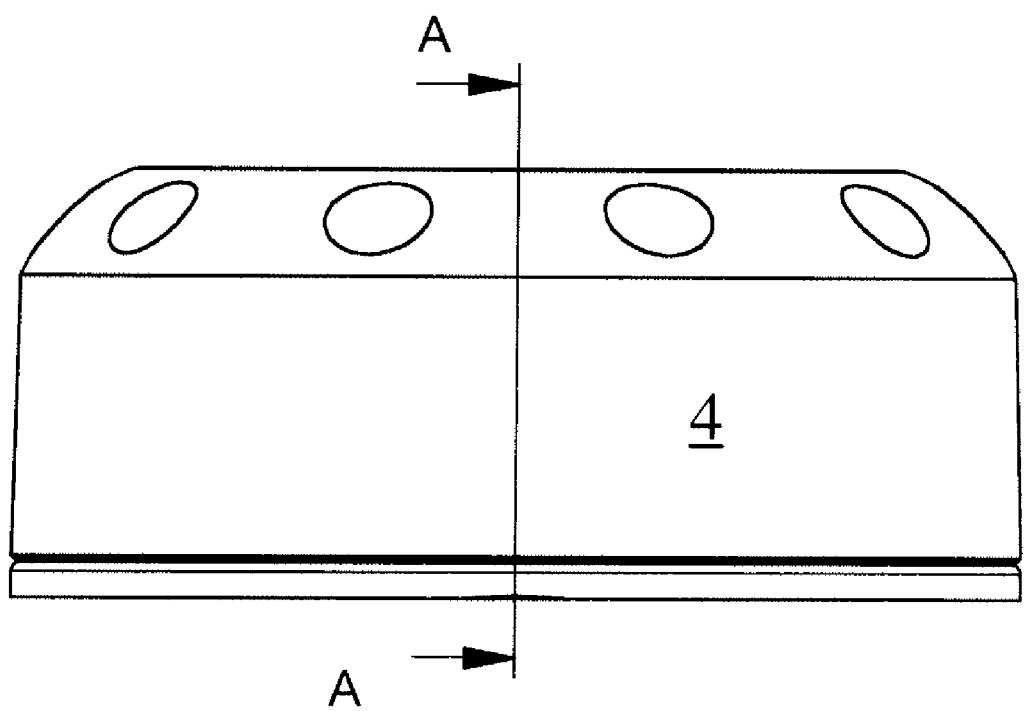
FIG. 4 is a side view of a locking part belonging to the housing according to the invention.

In the illustrated embodiment, as shown in FIG. 3, each bayonet connector 13 has a base 16 in a plane running perpendicular to the direction of insertion, a diagonal surface 17 connected to the base 16 and a head 18 in a second plane running perpendicular to the direction of insertion at the upper end of the diagonal surface 17. The base 16, surface 17 and head 18 are distributed alternately over the entire perimeter of the first bayonet part 14. The head 18 on the first bayonet part 14 running perpendicular to the direction of insertion is assigned to an opposing surface 19 (FIG. 5) on the second bayonet part 15 running perpendicular to the direction of insertion. In the connected position, each opposing surface 19 of the second bayonet part 15 lies against the corresponding head 18 of the first bayonet part 14. Thus, two surfaces running perpendicular to the direction of insertion correspond, namely the opposing surface 19 on the second bayonet part 15 and the head 18 on the first bayonet part. The result is—seen in total over the entirety—always a uniform gap, preferably a gap having a gap width of zero.

Figure 5:
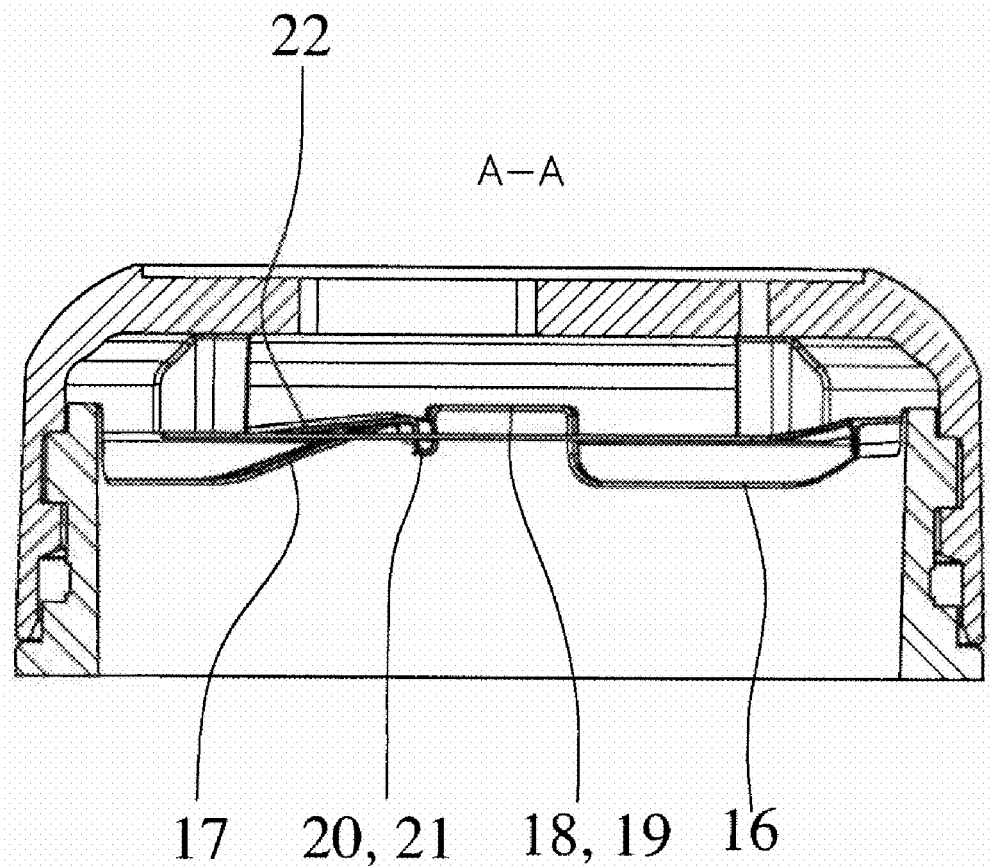
FIG. 5 is a sectional view of the locking part taken along line A-A in FIG. 4.

A preferred embodiment of a housing 1 according to the invention is shown in the drawings in which in each first bayonet part 14 of each bayonet connector 13 a latch recess 20 is realized between the diagonal surfaces 17 and the following heads 8, which is engaged by a latch spring 21 on the second bayonet part 15 of each bayonet connector 13 in the connected position shown in FIG. 5, thereby preventing releasing of the connection.

What is not shown in the drawing is that, in a preferred embodiment of the housing 1 according to the invention, releasing of the bayonet connector 13 or, respectively, bayonet connectors 13 is only possible using a special tool that is not available to the user of the housing 1 according to the invention. For example, such a tool that is not available to the user of the housing 1 according to the invention can be one that can lift the latch spring 21 out of the latch recess 20 against the force of the latch spring 22.

Finally, what is also not shown is that, in a further preferred embodiment, the latch spring 21 can be assigned to at least one electric contact. This electric contact—a break, a make or a changeover contact—can signal whether or not the connections at all connection joints, i.e., connection joints 9, 10, 11 & 12 in the illustrated embodiment, are actually faultlessly realized with the bayonet connectors 13.

As described, the embodiment of a housing 1 according to the invention shown in FIGS. 1 & 2 is one that has two receiving parts 2 & 3. For this reason, this housing 1 can be used for an electric or electronic device that is characterized by a modular construction, in which namely a functional unit having its own functional efficiency can be provided in both receiving parts 2 & 3, for example, on the one hand, an energy supply unit, and on the other hand, a measuring unit or a measuring and evaluation unit.

What is claimed is:

1. Housing for an electric or electronic device having at least one receiving part for accommodating at least one of electric and electronic components, parts, component groups and parts groups in an interior thereof, having at least one locking part for closing the receiving part, and having a bayonet connector for connecting the at least one locking part with the at least one receiving part, having a first connector part on the at least one locking part and a second connector part on the at least one receiving part which engage each other in a connected position wherein one of the first and second connector parts has a base in a plane running perpendicular to a direction of insertion of the connector part on one of the locking and receiving parts with the connector part on the other of the locking and receiving parts, a diagonal surface running diagonally from the base toward a head that runs perpendicular to the direction of insertion, the base, diagonal surface and head being distributed alternately around the entirety periphery of the first connector part.

2. Housing according to claim 1, wherein the head of the first connector part is received by a complementary shaped portion having opposing surface running perpendicular to the direction of insertion on the other of the first and second connector parts.

3. Housing according to claim 1, wherein a latch recess is provided between the diagonal surface and the head.

4. Housing according to claim 3, wherein a latch member is provided on the second of the connection parts, the latch member latching into said latch recess in the connected position.

5. Housing according to claim 4, characterized in that the latch member is a latch spring.

6. Housing according to claim 5, wherein it is only possible to release the bayonet connector by lifting the latch member out of the latch recess against the force of the latch spring.

7. Housing according to claim 4, wherein releasing of the bayonet connector is only possible using a special tool.

8. Housing according to claim 4, wherein at least one of the latch recess and the latch spring is provided with at least one electric contact.

9. Electric or electronic device having a housing having two receiving parts each of which accommodates a functional unit having its own functionality in a modular manner in an interior thereof, each functional unit being comprised of at least one of electric and electronic components, parts, component groups and parts groups, wherein a locking part is provided for closing each receiving part, and wherein a bayonet connector is provided for connecting the two receiving parts with each other and a respective additional bayonet connector is provided for connecting each locking part with each of the receiving parts, the bayonet connector having a first connector part on one of the receiving parts and a second connector part on the other of the receiving parts, the first and second connector parts being engaged with each other in a connected position, wherein the additional bayonet connectors comprise a first connector part on each receiving part and a second connector part on the respective locking part, the first connector part on each receiving part and the second connector part on the respective locking part being engaged with each other in a connected position.

* * * * *